(12) United States Patent
Yong et al.

(10) Patent No.: US 7,791,182 B2
(45) Date of Patent: Sep. 7, 2010

(54) SEMICONDUCTOR COMPONENT HAVING MAXIMIZED BONDING AREAS OF ELECTRICALLY CONDUCTIVE MEMBERS CONNECTED TO SEMICONDUCTOR DEVICE AND CONNECTED TO LEADFRAME AND METHOD OF PRODUCING

(75) Inventors: Wae Chet Yong, Melaka (MY); Mohd Fauzi HJ Mahat, Melaka (MY); Stanley Job Doraisamy, Kuala Lumpur (MY); Tien Lai Tan, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 126 days.

(21) Appl. No.: 12/067,113

(22) PCT Filed: Sep. 27, 2005

(86) PCT No.: PCT/IB2005/002893

§ 371 (c)(1),
(2), (4) Date: Jul. 10, 2008

(87) PCT Pub. No.: WO2007/036757

PCT Pub. Date: Apr. 5, 2007

(65) Prior Publication Data

US 2009/0045493 A1    Feb. 19, 2009

(51) Int. Cl.
H01L 23/495    (2006.01)
(52) U.S. Cl. ............ 257/676; 257/782; 257/784; 257/E23.07; 438/15; 438/123
(58) Field of Classification Search .......... 257/695
See application file for complete search history.

(56) References Cited

U.S. PATENT DOCUMENTS

| | | | |
|---|---|---|---|
| 5,300,815 A | 4/1994 | Rostoker | |
| 5,767,567 A | 6/1998 | Hu et al. | |
| 6,756,658 B1 | 6/2004 | Gillett et al. | |
| 2003/0011051 A1 | 1/2003 | Woodworth et al. | |
| 2009/0236728 A1* | 9/2009 | Satou et al. ............ | 257/692 |

FOREIGN PATENT DOCUMENTS

JP    2087535    3/1990

* cited by examiner

*Primary Examiner*—Stephen W Smoot
(74) *Attorney, Agent, or Firm*—Dicke, Billig & Czaja, PLLC

(57) ABSTRACT

A semiconductor component and method for producing. The semiconductor component includes a semiconductor device and a leadframe. A package layout is defined and the orientation of electrically conductive members with respect to the semiconductor device and inner contact areas of the leadframe is altered so as to maximize the interfacial bonding area. The constraints of the standard package dimensions and the component assembly method are taken into account.

17 Claims, 6 Drawing Sheets

SEMICONDUCTOR COMPONENT HAVING MAXIMIZED BONDING AREAS OF ELECTRICALLY CONDUCTIVE MEMBERS CONNECTED TO SEMICONDUCTOR DEVICE AND CONNECTED TO LEADFRAME AND METHOD OF PRODUCING

CROSS-REFERENCE TO RELATED APPLICATIONS

This Utility Patent Application is a National Filing under 35 U.S.C. 371 of International Application PCT/IB2005/002893, filed Sep. 27, 2005, incorporated herein by reference.

BACKGROUND

This disclosure relates to methods for increasing the current carrying capacity of a semiconductor component and to semiconductor components with increased current carrying capacity.

High power semiconductor components such as diodes and transistors, e.g., MOS-FETs and IGBTs, are normally provided to the customer as a packaged semiconductor component. The packaged semiconductor component, typically, has one of a number of standard package outlines which conforms to agreed industry standards regarding the outer form and dimensions of the plastic package as well as the number, dimensions and spacing of the pins. A standard package outline has the advantage that the component can be simply mounted on standardized printed circuit boards.

However, the packages suffer from the disadvantage that the current carrying capacity is limited. In order to increase the current carrying capacity, it is known, for example from US 2003/0011051, to provide two or more bonding wires which are connected in parallel between the power electrode of the semiconductor die and the source lead of the leadframe.

The leadframe and package outline are also modified in order to further increase the current carrying capacity. The pin sequence of the package is changed in order to increase the size of the source post, or inner contact area of the source pin. Additionally, the cross-sectional area of the external portions of the pins is increased to increase the current carrying capacity of the package.

However, although the current carrying capacity may be increased by modifying the package and pins, the advantages offered to the user of a standard package outline and a standard pin arrangement are lost. The user, therefore, has to modify the board in order to be able to mount the modified package. This increases the complexity for the user and increases the costs which can outweigh the benefit of a higher current carrying capacity.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
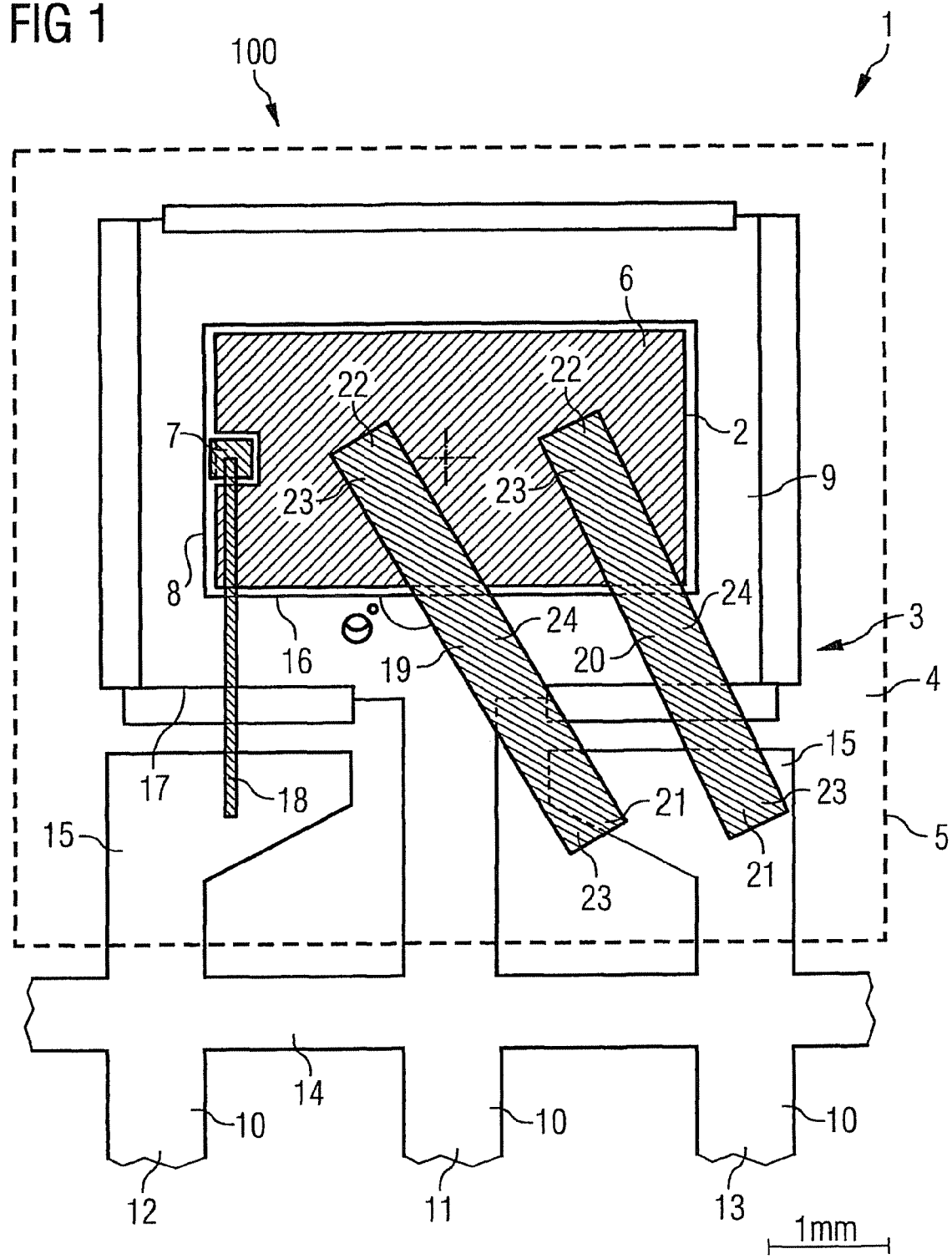
FIG. 1 illustrates a semiconductor component assembled after a first iteration of the method of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to embodiments of the invention, a method for increasing the current carrying capacity of a semiconductor component having a standard package outline and a standard pin arrangement includes the following processes.

Firstly, a package layout is defined. The package layout includes a die pad having an edge defining a first line and lateral dimensions. The package layout also includes a plurality of leads disposed on one side of the die pad. Each lead has an inner portion and an outer portion. At least one drain lead extends from the die pad in a direction defining a second line. The inner portion of each of the remaining leads includes an inner contact area which is spaced at a distance from the die pad. Each of the remaining leads extends in a direction parallel to the second line. The inner contact area of each remaining lead has maximum allowable dimensions. The package layout further includes a semiconductor device, which has lateral dimensions which are equal to or less than the lateral dimensions of the die pad, and a plurality of electrically conductive connecting members.

The area of the inner contact area is defined and the cross-sectional area of the electrically conductive connecting members is defined. When the electrically conductive connecting member is bonded to a surface, an interfacial bonding area is created between the electrically conductive connecting members and the surface. The interfacial bonding area of the electrically conductive connecting members having the defined cross-sectional area after it is bonded to a surface is calculated. The following optimization method is then performed:

(a) a first end of the electrically conductive connecting member is orientated with respect to the second line to maximize the interfacial bonding area between the electrically conductive connecting member and the inner contact area;

(b) a second end of the electrically conductive connecting member is orientated with respect to the first line to maximize the interfacial bonding area between the electrically conductive connecting member and the upper surface of the semiconductor device;

(c) the semiconductor device is orientated with respect to the first line so that the central portion of the electrically conductive connecting member has an orientation with respect to the edge of the semiconductor device which is as close to 90° as possible and so that the semiconductor device remains within the area of the die pad;

(d) the unoccupied area of the inner contact area is determined;

(e) it is then determined if the unoccupied area is equal to or larger than a predetermined value. The predetermined value is the area required by the bonding tool clamps, for example. If the unoccupied area is not equal to or larger than a predetermined value process (f) is performed. If the unoccupied area is equal to or larger than a predetermined value process (g) is performed, (f) the relationship between the area of the inner contact area and the cross-sectional area of the electrically conductive connecting member is changed by increasing the area of the inner contact area and/or decreasing the cross-sectional area of the electrically conductive connecting means. The interfacial bonding area is calculated and processes (a) to (e) of the method are repeated;

(g) it is then determined if the unoccupied area is larger than a second predetermined value. The second predetermined value defines a non-optimum interfacial area. If the unoccupied area is larger than the second predetermined value, the cross-sectional area of the electrically conductive connecting member is increased, the interfacial bonding area is calculated and processes (a) to (e) are repeated. If the unoccupied area is not larger than a second predetermined value, the determined values are output.

The values which may be determined by this method include: the area of the inner contact area; the cross-sectional area of the electrically conductive connecting member; the orientation of the first end of the electrically conductive member with respect to the second line; the orientation of the second end of the electrically conductive member with respect to the first line, and the orientation of the semiconductor device on the die pad. The interfacial bonding area and the unoccupied area of the inner contact area may also be output.

These values are used in the assembly of the semiconductor component in order that the resulting component has an increased current carrying capacity.

A semiconductor component may then be assembled by firstly providing a lead frame in which the inner contact area has lateral dimensions and an area as determined by the disclosed method.

The semiconductor device is then mounted on the die pad with an orientation with respect to the first line, defined by an edge of the die pad, as determined by the method according to the invention.

The semiconductor device is electrically connected to the inner contact area by electrically conductive connecting members having a cross-sectional area according to the disclosed method. The electrically conductive connecting member is orientated with respect to the semiconductor device and to the inner contact area as determined by the method.

In a further process of the assembly, further electrical connections may be provided between control contacts, such as the gate contact, and the lead frame. The semiconductor device, die pad, electrically conductive connecting members and the inner portions of the leads are then encapsulated in a plastic molding compound. This is performed, typically, by a transfer molding process in which the mold provides the component with a plastic housing mass with outer surfaces which correspond to the desired standard package outline.

The disclosed method provides a method by which the current carrying capacity of a semiconductor component may be increased without modifications to the package outline or to the pin arrangement. The method provides a means by which the internal layout of the package is improved, and may be optimized, so as to increase the current carrying capacity.

In this context, the pin arrangement is used to denote the external portions of the pins which are seen by the customer or user. The pin arrangement refers to the size of the individual pins, their spacing from each other and their arrangement with respect to the plastic package housing of the component.

This optimization of the internal layout of the package has the further advantage that a semiconductor device with a particular current demand may be accommodated in a component having a smaller package outline. This is particularly desirable as the miniaturization of microelectronic systems without a loss in power or functionality is, in general, one of the driving forces behind developments in this technical field.

The method according to embodiments of the invention provides a method by which the interfacial area between the semiconductor device and the electrically conductive connecting means and between the inner contact area of the lead of the leadframe and the electrically conductive connecting members is optimised within the confines of the standard package outline.

Therefore, the method also provides the maximum interfacial bonding area allowable for an inner contact area which itself has maximum allowable dimensions due to the standard package outline. An increased interfacial bonding area reduces the resistance of the electrically conductive connecting means and enables a larger current to be carried.

Additionally, the method takes the assembly process into account. The electrically conductive connecting member is typically attached to the semiconductor device and to the inner contact area using a bonding tool. For electrically conductive connecting members in the form of bond wires, this is performed by a wire bonder. The bonding tool, typically, has clamps which are in contact with the lead frame, and, in particular, the inner contact area during the bonding process. This prevents movement of the leads and the lead frame during the bonding process.

The method provides a method by which the interfacial bonding area is maximized while leaving sufficient area of unoccupied that the bonding tool can be placed on the inner contact area. The bonding process can, therefore, be reliably carried out.

The method also includes the feature that the electrically conductive connecting member is orientated with respect to the semiconductor device so that the central portion of the electrically conductive connecting means has an orientation which is as close to 90° as possible to the edge of the semiconductor device. This orientational relationship increases the interfacial bonding area and enables the length of the connection to be reduced. This reduces the inductance of the wire which further improves the functionality of the component. This feature of the method also further improves the reliability of the bonding process as well as the reliability of the electrical connection after it has been formed.

Furthermore, the method also includes a process by which the orientation of the semiconductor device on the die pad is altered under the constraint that the semiconductor device remains within the area of the die pad. Therefore, the outline of the package is not changed. The semiconductor device is orientated with respect to the edge of the die pad so that the central portion of the electrically conductive connecting means has an orientation with respect to the edge of the semiconductor device which is as close to 90° as possible. This reduces the length of the electrically conducting connecting means which reduces resistive losses and increases the current carrying capacity of the component.

In an embodiment, the cross-sectional area of the electrically conductive connecting member is selected from a plurality of pre-defined values. This embodiment takes into account that electrically conductive connecting members, such as bond wires, are typically provided by a manufacturer which provides the material in a limited range of standard sizes. This material is cheaper than material made specifically for a customer order. Therefore, this embodiment of the method allows for the optimisation of standard sized electrically conductive connecting means within the standard package housing. This optimises the current carrying capacity of the component while keeping the cost of the component as low as possible.

In an embodiment, the electrically conductive connecting member is provided by a bond wire with an essentially circular cross-section. In an alternative embodiment, the electrically conductive connecting member is provided by a foil with an essentially rectangular cross-section.

In an embodiment, the first end of the electrically conductive connecting member is orientated approximately perpendicular to the second line. This arrangement maximizes the interfacial bonding area between the bond formed at the first end of the electrically conductive connecting member and the inner contact area. In a further embodiment, the second end of the electrically conductive connecting member is orientated approximately parallel to the first line. In this embodiment, the interfacial bonding area is maximized between the bond at the second end of the electrically conductive connecting means and the semiconductor device.

In a further embodiment, both the first end and the second end are orientated approximately perpendicular to the edge of the inner contact area and semiconductor device respectively. The edge of the inner contact area is essentially parallel to the first line defined by the edge of the die pad and essentially perpendicular to the second line defined by the drain lead. This type of bond is commonly referred to as an S bond.

In a further embodiment of the invention, the first predetermined value defining the unoccupied area of the inner contact area required by the bonding tool clamps is the area required by the bonding tool clamps in a single pass bonding process.

In a single pass bonding process, all of the bonds connecting the semiconductor device to the inner contact area are performed with the bonding tool clamps in one position. Two or more physically isolated electrically conductive connecting members may be connected in parallel between the semiconductor device and the inner contact area without repositioning the bonding tool clamps. This embodiment has the advantage that the provision of two or more electrically conductive connecting members connected in parallel further reduces the resistance of the current carrying pass within the package outline. As all of the bonds are formed using one position of the bonding tool clamps, the bonding process can be carried out efficiently.

In an alternative embodiment, the first predetermined value defining the unoccupied area of the inner contact area required by the bonding tool clamps is the area required by the bonding tool clamps in a two pass bonding process.

In a two pass bonding process, the bonding tool clamps are placed on the inner contact area and/or lead frame in a first position while a first electrically conductive connecting members is electrically connected between the semiconductor device and the inner contact area. After the first electrically conductive connecting member is bonded, the bonding tool clamps are moved to a second position. A second electrically conductive connecting member is then provided between the semiconductor device and the inner contact area. The first and second electrically conductive connecting members are connected in parallel between the semiconductor device and the inner contact area so as to reduce the resistance of the current path.

A two pass bonding process has the advantage that the area of the inner contact, which will be later occupied by the second electrically conductive connecting member, can be used by the bonding tool clamp while attaching the first electrically conductive connecting members. This can provide a more reliable clamping of the bonding tool on the lead frame during the first pass.

In a further embodiment, it is also possible that the wire bonding tool clamps are outside of the inner contact area during the second pass, i.e. when the second electrically conductive conducting member is produced between the semiconductor device and the inner contact area. This is possible due to the stability provided to the lead frame and inner contact area by the first electrically conductive connecting member. This embodiment has the advantage that the area, which is unoccupied by the interfacial bonding areas, is reduced. Therefore, the interfacial bonding area may be increased. This further reduces the resistance of the current path and can also enable the current carrying capacity of the component to be increased.

Their further embodiment, the following additional processes may be carried out after process (d) of the optimization process outlined above.

The area required by each bonding tool clamp within the area of the inner contact area is defined and the lateral position of the bonding tool clamp within the area of the inner contact area is defined. The lateral position of the unoccupied area of the inner contact area is determined. A comparison of the lateral position of the unoccupied area and the defined lateral position of the bonding tool clamp and the defined area required by the bonding tool clamp is carried out. If the defined lateral position of the bonding tool clamp and the defined area required by the bonding tool clamp lie outside the lateral position of the unoccupied area, process (f) of the method described above is performed. If the defined lateral position of the bonding tool clamp and the defined area required by the bonding tool clamp lie within the lateral position of the unoccupied area process (g) of the method described above is performed.

This embodiment of the invention takes into account the lateral position of each bonding clamp within the area of the inner contact area. Therefore, the different area requirements for a single pass and a two pass bonding process can be taken into account and the interfacial bonding area maximised accordingly.

The invention also provides a semiconductor component having a standard package outline and a standard pin arrangement which includes a die pad having an edge defining a first line and having a lateral dimensions. The component also includes a plurality of leads disposed on one side of the die pad. Each lead has an inner portion and an outer portion. At least one drain lead extends from the die pad in a direction defining a second line. The inner portion of each of the remaining leads includes an inner contact area which is spaced at a distance from the die pad. Each lead extends in a direction parallel to the second line. The semiconductor component also includes a semiconductor device having lateral dimensions which are equal to or less than the lateral dimensions of the die pad and a plurality of electrically conductive connecting members. The standard package outline is a TO252 package outline and the electrically conductive connecting members include bond wires with a diameter of greater than approximately 350 μm.

The semiconductor component, therefore, includes bond wires with a larger diameter than can be conventionally used in component with a TO252 package outline. Therefore, the current carrying capacity of the component can be increased by using the method of the invention to optimise the internal layout of the component so that the diameter of the bond wires may be increased and the component can be reliably assembled. In an embodiment, the component includes two bond wires with a diameter of 350 μm which stretch between the semiconductor device and a single inner contact pad. In this embodiment, the component also has a TO252 package outline.

In further embodiment, the component includes two or more bond wires with a diameter of approximately 500 μm. The two or more bond wires reach between the semiconductor device and a single inner contact area. The provision of two bond wires with a diameter of approximately 500 μm further increases the current carrying capacity of a component with a TO252 package outline.

In a further embodiment, the semiconductor device is orientated with respect to the first line, defined by an edge of the die pad, by an angle θ, where 0°<θ<90°. The semiconductor device is orientated so that the angle formed between the central portion of the bond wire and the edge of the semiconductor device is as close to 90° as possible under the constraint that the semiconductor device is located within the lateral dimensions of the die pad. The semiconductor device can be mounted inside the standard package outline which avoids modifying the standard dimensions of the package.

As the angle formed between the central portion of the bond wires and the edge of the semiconductor device is as close to 90° as possible, the length of the bond wire between the semiconductor device and the inner contact area can be reduced and may be chosen to be as short as possible. This reduces inductance and improves the functionality of the device. In addition, the heat dissipated by the component is reduced which further improves the functionality of the component, for example the switching speed of a transistor.

In an embodiment, the semiconductor device is a high power semiconductor device. The high power semiconductor device may be a power switching device such as a MOSFET, a IGBT, a BJT or a diode. The power switching device may also be a vertical power device.

In the description, the semiconductor power switch is described as having at least one source electrode, at least one drain electrode and at least one gate electrode as is used for MOSFET switches. However, this nomenclature is not intended to limit the semiconductor power switch to a MOSFET. For other types of semiconductor power switch, this nomenclature refers to the corresponding feature. For a BJT, gate corresponds to base, source corresponds to emitter and drain corresponds to collector. For a IGBT, source corresponds to emitter and drain corresponds to collector.

In summary, embodiments of the invention provide a method by which the current carrying capacity of a semiconductor component with a standard package outline and a standard pin arrangement can be increased. In one embodiment of the invention, a semiconductor component is provided which has a TO252 outline, also known as a Dpak 3 package, which includes two bond wires with a diameter of 350 μm. The bond wires include aluminium and provide two parallel electrical connections between the source inner contact area or source lead post and a semiconductor MOSFET device.

In a further embodiment, a component with a TO252 package outline includes two aluminium source leads connected in parallel between the source contact of the semiconductor device and the inner contact area of the source lead which each have a diameter of 500 μm. The current carrying capacity of the package is increased to around 90 Amps.

Embodiments of the invention, therefore, provide a Dpak 3 package which is suitable for applications requiring 90 Amps. In conventional packages, this capacity is provided only by Dpak5 packages which have 5 pins and are much larger. The invention, therefore, provides a package without redundant leads and removes the design constraints of the PCB layout which arise as a result of the use of a Dpak5 package for the MOSFET device.

FIG. 1 illustrates a plan view of a semiconductor component 1 assembled after a first iteration of the disclosed. The semiconductor component 1 includes a semiconductor device 2, a lead frame 3 and a plastic housing 4 having a TO252 package outline 5. The semiconductor device 2 is a vertical MOSFET device. The upper surface of the MOSFET device includes a source contact 6 and a gate contact 7. The lower surface of the MOSFET device includes the drain contact 8 which cannot be seen in FIG. 1.

According to the method of an embodiment of the invention a package layout 100 is defined. The package layout was defined as conforming to the TO252 standard. Therefore, in the illustrated embodiment, the lateral dimensions of the leadframe 3, including a die pad 9, the number, position and dimensions of the outer portions leads 10 and the maximum lateral dimensions of a semiconductor device which will fit within the lateral dimensions of the die pad 9 are defined by this standard.

In the package layout 100, the lead frame 3 includes a die pad 9, which is essentially rectangular, and three leads, or pins 10 which are arranged adjacent the long side 17 of the die pad 9 which defines a first line. The outer portion of each of the three leads 10 extends in a direction which is essentially perpendicular to the long edge 17 of the rectangular die pad 9. Each lead 10 extends in a direction essentially parallel to each of the other leads 10 of the component 1. The direction of the leads defines a second line.

The central lead 11 extends from and is mechanically and electrically connected to the die pad 9 and provides the drain lead 11 of the package 1. The lead 12 positioned to one side (the left in the orientation of the component illustrated in FIG. 1) of the drain lead 11 is the gate lead of the component 1. The lead 13 positioned on the opposite side (on the right in the orientation of the component illustrated in FIG. 1) of the drain lead 11 is the source lead 13 of the semiconductor component 1. The three leads 10 each include an inner portion and an outer portion. The three leads 10 are joined by support bar 14 which is disposed approximately perpendicular to the three leads 10. The support bar 14 holds the lead-frame 3 within a lead frame strip which includes a plurality of essentially identical lead-frames 3 arranged in rows and columns which are not illustrated in FIG. 1 for clarity. The support bar 14 is removed after the component assembly process is complete to electrically isolate the three leads 11, 12, and 13.

The inner portion of the gate lead 12 and the source lead 13 includes an inner bonding area or lead post 15. The inner contact areas 15 are positioned at a short distance from the edge of the die pad 3 and are, therefore, not directly mechanically attached to, or electrically connected to, the die pad 9.

According to the method of the invention, an area is defined for the inner bonding area 15. This area is, in this embodiment of the invention defined as A. The inner bonding area 15 extends, in each case, inwardly towards the central drain lead 11. The portion of the inner contact area 15 adjacent to the edge 17 of the die pad 9 is essentially rectangular. The portion of the inner die pad 15 from which the source lead 13 extends is approximately triangular. The form of the inner contact areas 15 can be considered as a rectangle in which the corner adjacent the drain lead 11 which faces away from the die pad 9 has been removed.

The gate electrode 7 positioned on the upper surface of the semiconductor device 2 is connected to the inner contact area 15 of the gate lead 12 by a single gold bond wire 18 which has a diameter of 75 μm.

According to the method of the invention, the cross-sectional area of the connecting means which electrically connect the source contact 6 to the leadframe 3 is then defined. In this embodiment of the invention, the source electrode 6 is electrically connected to the inner contact area 15 of the source lead 13 by two bond wires 19 and 20 which each has a defined diameter of 350 μm.

The interfacial bonding area 21, which defines the area of the bond formed between the bond wires 19 and 20 and the upper surface of the source contact 6 and the upper surface of the inner contact area 15 was calculated. This can be done based on the known bond process parameters such temperature and pressure of the bond process for a bond wire with a diameter of 350 μm. The optimization method of the invention was then carried out.

The first end 21 of each source bond wire 19, 20 was orientated with respect to the inner contact area 15 so as to maximise the interfacial bonding area.

The second end 22 of each bond wire 19,20 was orientated with respect to the edge of the die pad to maximise the interfacial bonding area between the second end 22 of each bond wire 19,20 and the upper surface of the semiconductor device 2. As can be seen in FIG. 1, the semiconductor device 2 was orientated such that the bond wires 19, 20 form an angle of 45° to the edge of the semiconductor chip.

The semiconductor device 2 is, in this embodiment of the invention, also essentially rectangular and is positioned approximately concentrically on the rectangular die pad 9. Therefore, the long edge 16 of the semiconductor device 2 lies in a plane which is essentially parallel to the long edge 17 of the die pad 9. The angle between the long edge 16 of the semiconductor device 2 and the long edge 17 of the die pad 9 is, therefore, approximately 0°.

With the restrictions of the size of the semiconductor device and lateral dimensions of the inner contact area 15, according to the further conditions regarding the area required by the bonding tool clamps, an angle of 45° between the second end 22 of the bond wires 19, 20 and the edge 16 of the semiconductor device 2 is as close as possible to an angle of 90°.

As can be seen in FIG. 1, the area A of the inner contact area 15 is insufficient to accommodate the bond wires 19, 20. Therefore, according to the method of the invention, the area of the inner contact area was increased to a value B and the optimisation method repeated. The result of the second iteration of the optimisation method is illustrated in FIG. 2.

Features which are essentially the same as those illustrated in FIG. 1 are indicated by the same reference number in the following Figures and are not necessarily described in detail again.

Figure 2:
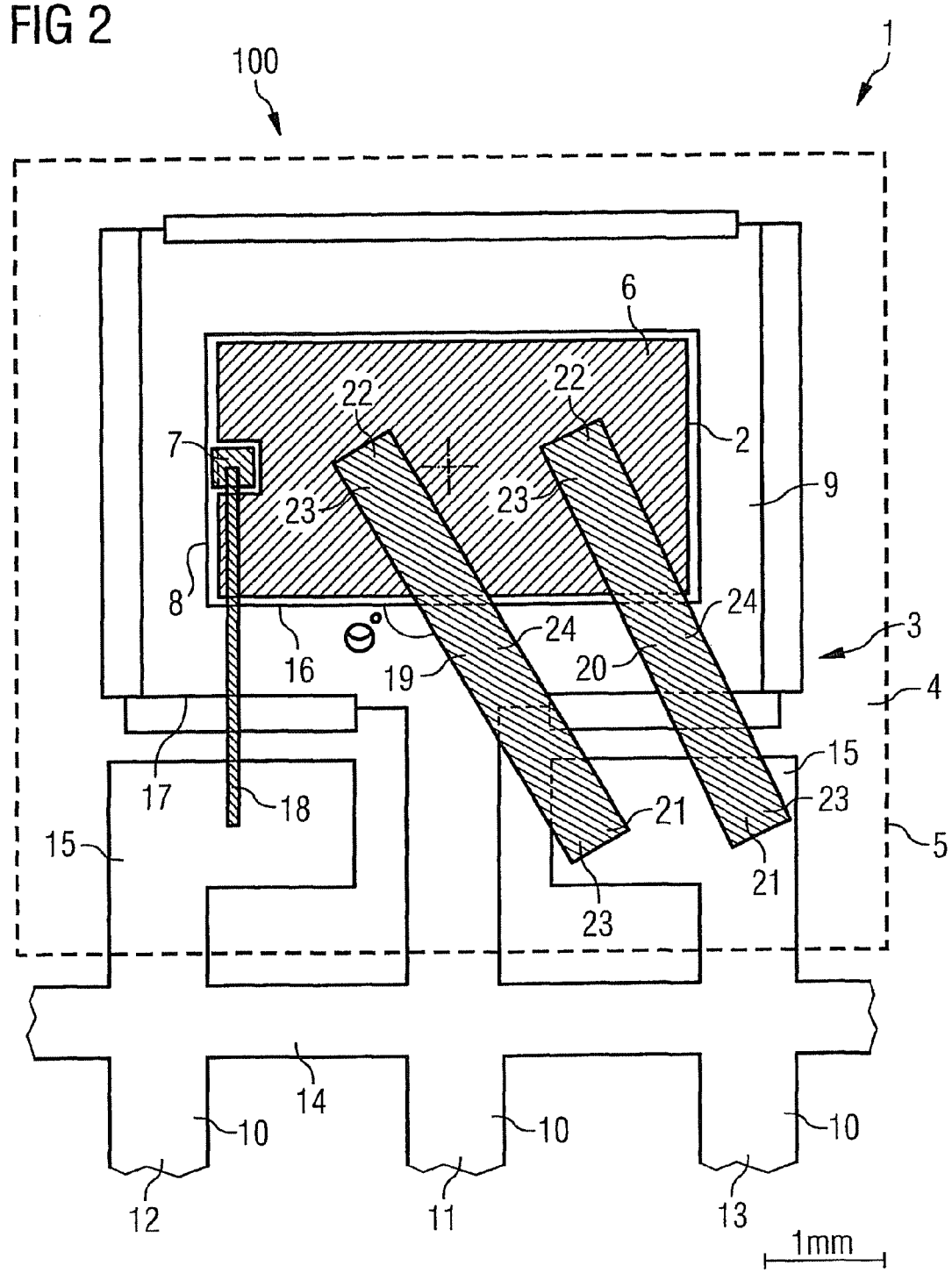
FIG. 2 illustrates a semiconductor component assembled after a second iteration of the method according to the invention is performed on the component of FIG. 1.

The semiconductor component of FIG. 2 differs from that of FIG. 1 in that the inner contact areas 15 are rectangular and have a larger area than the inner contact areas illustrated in FIG. 1. In the second iteration, the interfacial bonding areas were maximised and the orientation of the semiconductor chip with respect to the bond wires 19, 20 was chosen so as to provide an angle as close to 90° as possible.

A comparison of the area of the inner contact area 15 occupied by the interfacial bonding areas 23 and the unoccupied area illustrates that an inner contact area with an area of B is sufficiently large to accommodate two bond wires 19, 20 with a diameter of 350 μm within a TO252 package outline. Sufficient space also remains for the wire bonding clamps. The component as illustrated in FIG. 2, therefore, fulfils the criteria of the method of the invention.

After the semiconductor component 1 has been assembled according to the method of the invention, the semiconductor device 2, the die pad 9, the inner portions of the leads 10 including the inner contact areas 15, and the bond wires 18, 19, and 20 are encapsulated in a plastic mold material 4. The outer surfaces of the mold material 4 provide the outer surfaces of the semiconductor component 1. The outline of the package provided by these outer surfaces is indicated in FIG. 1 by the dashed line 5. In this embodiment of the invention, the semiconductor component 1 has a package outline 5 which corresponds to the dimensions of a TO252 package outline.

The position of the bonding tool clamps used to assemble a component according to various embodiments of the method according to the invention, are illustrated in relation to FIGS. 3 to 6.

Figure 3:
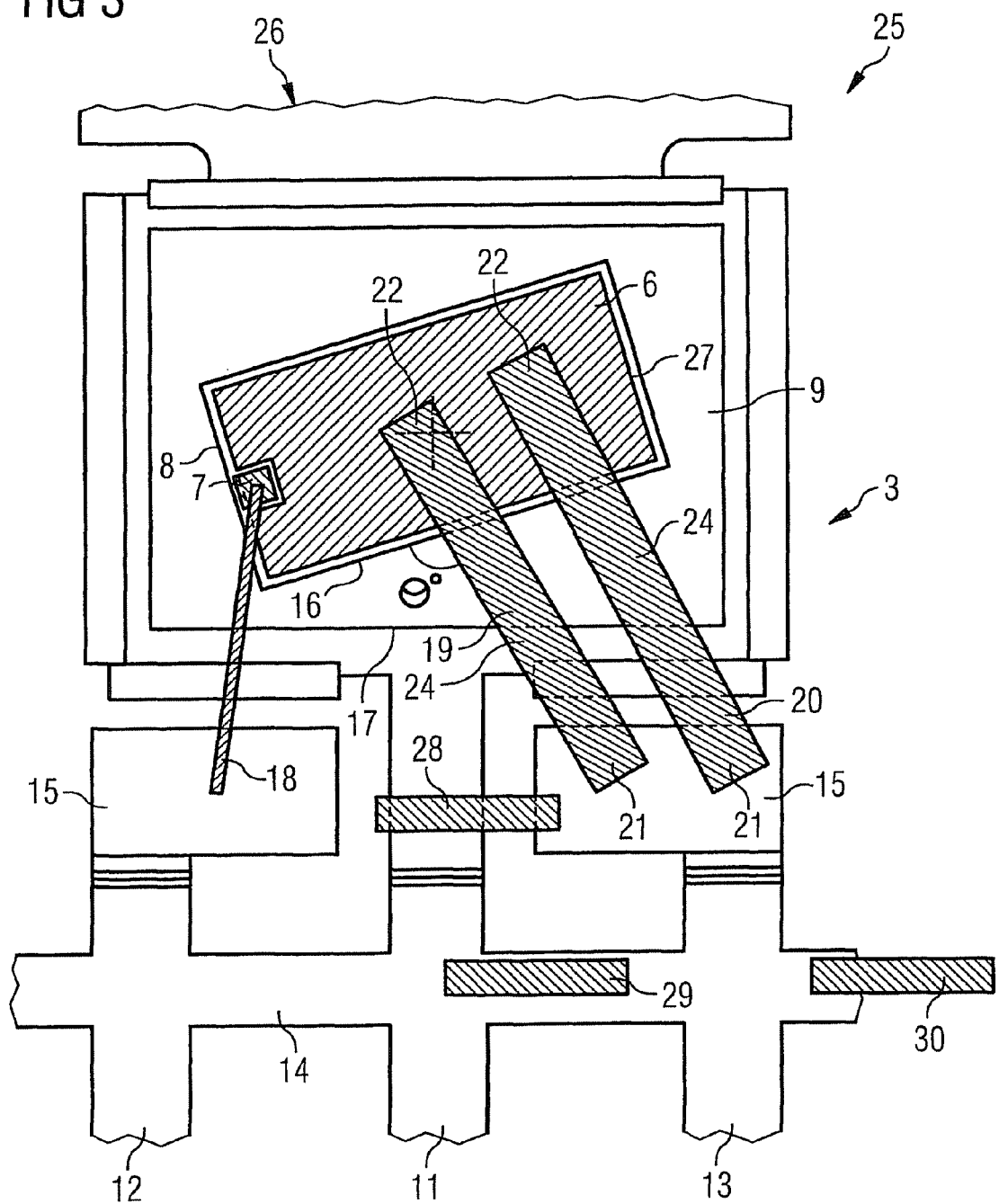
FIG. 3 illustrates the assembly of a semiconductor component according to a second embodiment of the invention.

FIG. 3 illustrates the assembly of a semiconductor component 25 according to a second embodiment of the invention and illustrates a component position 26 of a leadframe strip. The component position 26 is used to assemble a semiconductor component 25 with the TO252 package outline. Since FIGS. 3 to 6 illustrate the production method for the fabrication of the source wire bonds 19, 20, the package outline is not illustrated in the figures for clarity.

The semiconductor component 25, according to a second embodiment of the invention, differs from the semiconductor component 1 depicted in FIG. 2, in that the semiconductor device 27 has smaller lateral dimensions than the semiconductor device 2 of the first embodiment. The inner contact areas 15 have an area B as in the embodiment of FIG. 2.

The semiconductor device 27 is also a MOSFET device and its upper surface includes a source contact 6 and a drain contact 7. The drain contact 8 is positioned on its rear surface and is electrically connected to the die pad 9 and, therefore, the drain lead 11. The semiconductor component 25 was also assembled according to the method of the invention.

Since the lateral dimensions of the semiconductor device 27 are smaller, the semiconductor device 27 is orientated on the die pad so that the long edge 16 of the semiconductor device 27 lies at an angle of around 20° to the long edge 17 of the die pad 9. The source contact 6 is electrically connected to the inner contact that 15 of the source lead 13 by two wires 19, 20. The inner contact area 15 has essentially the same lateral dimensions as the inner contact area 15 illustrated in FIG. 2.

The two bond wires 19, 20 also include aluminium and have a diameter of approximately 350 µm.

The central portion 24 of the bond wires 19, 20 lies at an angle of approximately 85° to the long edge 16 of the semiconductor device 27. The semiconductor component 25 was assembled using an embodiment of the method of the invention in which the position of the bonding tool clamps 28, 29, and 30 required to form the two source wires 19, 20 in a single bonding pass process, is taken into account. The position of the bonding tool clamps in indicated in the figures by rectangles.

As can be seen in FIG. 3, the bonding tool clamp 28 is positioned so that it clamps the drain lead 11 and the bottom left hand corner of the essentially rectangular inner contact area 15 of the source lead 13. The two remaining bonding tool clamps 29, 30 placed in contact with the support bar 14 either side of the source lead 13. This arrangement provides a stable clamping of the lead frame 3 during the wire bonding process while also requiring that only a small area or the inner contact area 15 is occupied by the clamp 28 and is unavailable for use by the interfacial bonds 20.

The method according to the invention was used to determined an optimum combination of the area and position required by the bonding clamp 28, the available area of the inner contact area 15, the diameter of the wires 19, 20 and orientation of the semiconductor device 27 on the die pad 9. This combination of features results in an increased current carrying capacity of the semiconductor component 25 within a TO252 package outline. This package can carry up to 90 Amps.

Figure 4:
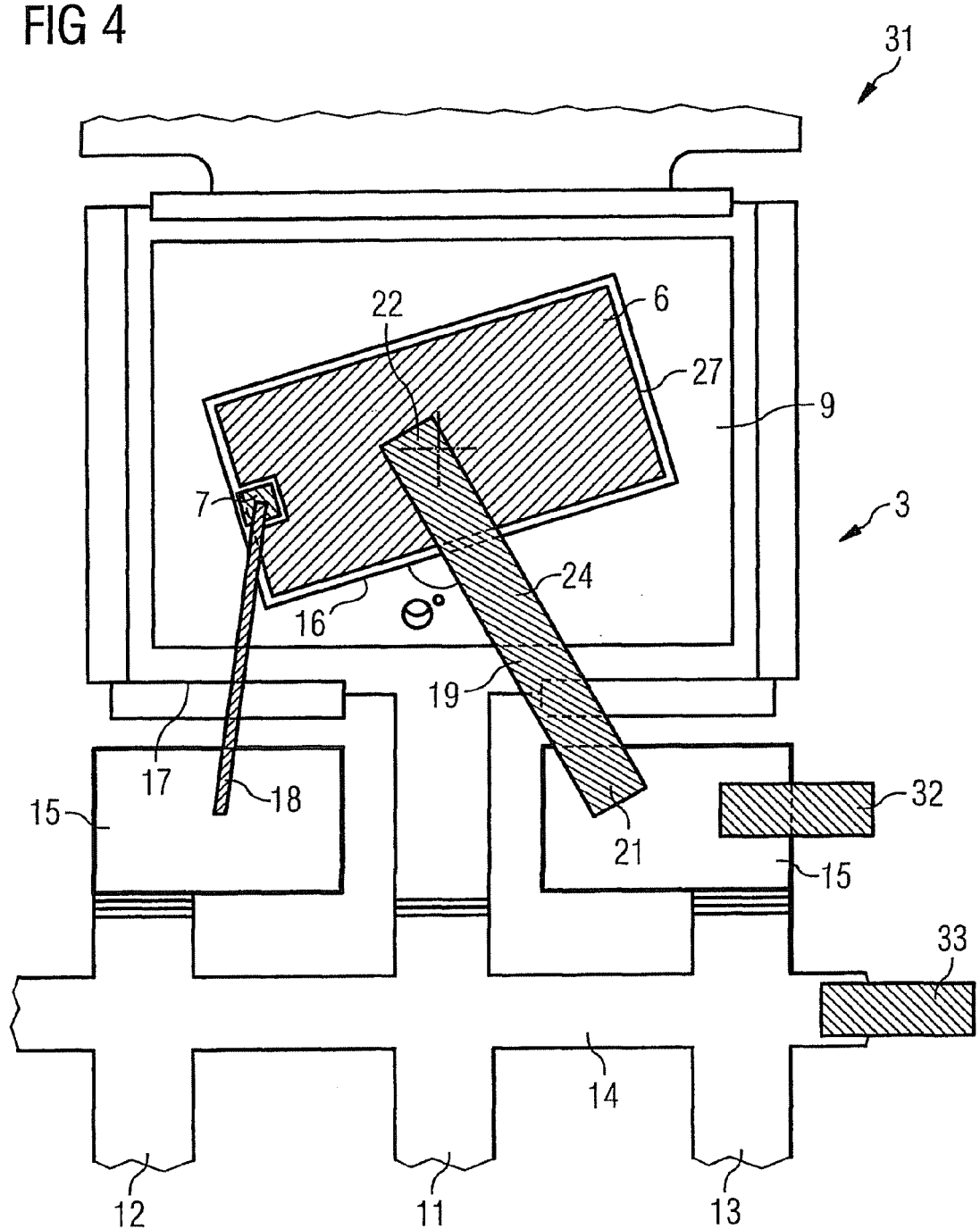
FIG. 4 illustrates the first position of the wire bond clamps when assembling a semiconductor component according to a third embodiment of the invention.
Figure 5:
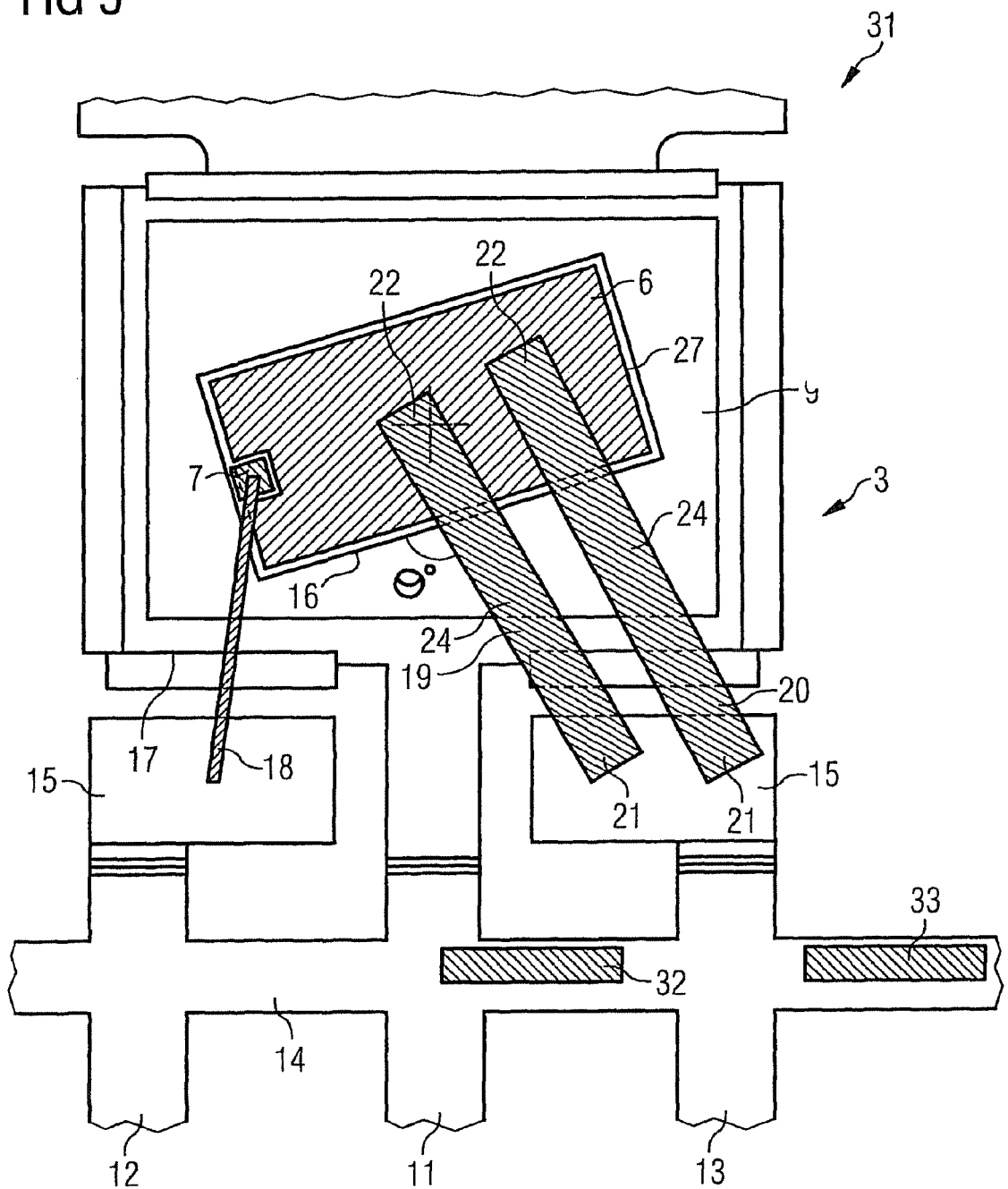
FIG. 5 depicts the second position of the wire bond clamps when assembling the semiconductor component of FIG. 4.

FIGS. 4 and 5 illustrate two stages in a method according to a third embodiment of the invention for the assembly of a semiconductor component 31 using a two-pass wire bonding method.

The semiconductor component 31 includes a MOSFET semiconductor device 27 and the lead frame 3. The lead frame 3 includes a rectangular die pad 9 and three leads 10 disposed on one of the long sides of the die pad 3. Similarly to the embodiments of FIGS. 1 and 2, the lead frame 3 of the semiconductor component 31 includes a central drain lead 11, a gate lead 12 and a source lead 13. The source lead 13 and the gate lead 12 include inner contact areas 15. Each inner contact area 15 is essentially rectangular, has an area B and extends from the innermost end of the inner portion of the respective gate lead 12 and source lead 13 towards the central drain lead 11. The lateral dimensions of the inner contact area 15 is approximately the same as in the embodiments illustrated in FIGS. 2 and 3.

The MOSFET device 27 is mounted with its rear surface on the upper surface of the die pad 9 so that the long side 16 of the MOSFET device 27 dies at an angle of approximately 20° to the long side 17 of the die pad 9. The gate electrode 7 is connected by a first bond wire 18 which includes gold and has a diameter of approximately 75 µm to the inner contact area 15 of the gate electrode 12.

The MOSFET device 27 will be electrically connected by two bond wires which reach between the source contact 6 and the inner contact area 15 of the source lead 13.

In this embodiment of the invention, the wire bonding of the source contact 6 to the source lead 13 occurs in two passes. In the first stage, illustrated in FIG. 4, the wire bonding tool clamps 32 and 33 are positioned on the lead frame 3 so as to simplify the production of a first bond wire 19 between the source electrode 6 and the inner contact area 15 of the source lead 13. As can be seen in FIG. 4, a wire bonding clamp 32 is positioned towards one side (the right side for the orientation of the component illustrated in FIG. 4) of the inner contact area 15 in approximately the lateral centre of the short side. A second wire bonding clamp 33 is positioned on the support bar 14 to the right of the source lead 13. This provides a stable clamping of the lead frame 3 while leaving the majority of the inner contact area 15 (the central and left hand regions for the orientation illustrated in FIG. 4) unoccupied so as to simplify the bonding of the first bond wire 19 to the inner contact area 15.

The lead frame 3 represents a single component position of a leadframe strip having a plurality of similar component positions, which are not illustrated in the Figure for clarity. In the first pass of the wire bond, a first wire bond 19 is produced between the source contact 6 of the MOSFET device 27 and the inner contact area 15 of the source lead 13 in each of the component positions. In the second pass of the wire bond tool over the lead frame strip, a second bond wire 20 will be produced in each of the component positions.

The production of the second bond wire 20 between the source electrode 6 disposed on the upper surface of the MOSFET device 27 and the inner contact area 15 of the source lead 13 is illustrated in connection with FIG. 5.

As can be seen in FIG. 5, the second bond wire 20 extends form the source electrode 6 to the inner contact area 15 in a direction which is essentially parallel to that of the first bond wire 19. Since the inner contact area 15 is already mechanically secured to the die pad via the first bond wire 19 and the mounted semiconductor device 27, the positioning of a bond wire clamp on the inner contact area in the second pass can be avoided. As can be seen in FIG. 4, the two clamps 32 and 33 are positioned on the support bar 14 either side of the source lead 13. This arrangement maximises the area available for bonding within the inner contact area 15.

Figure 6:
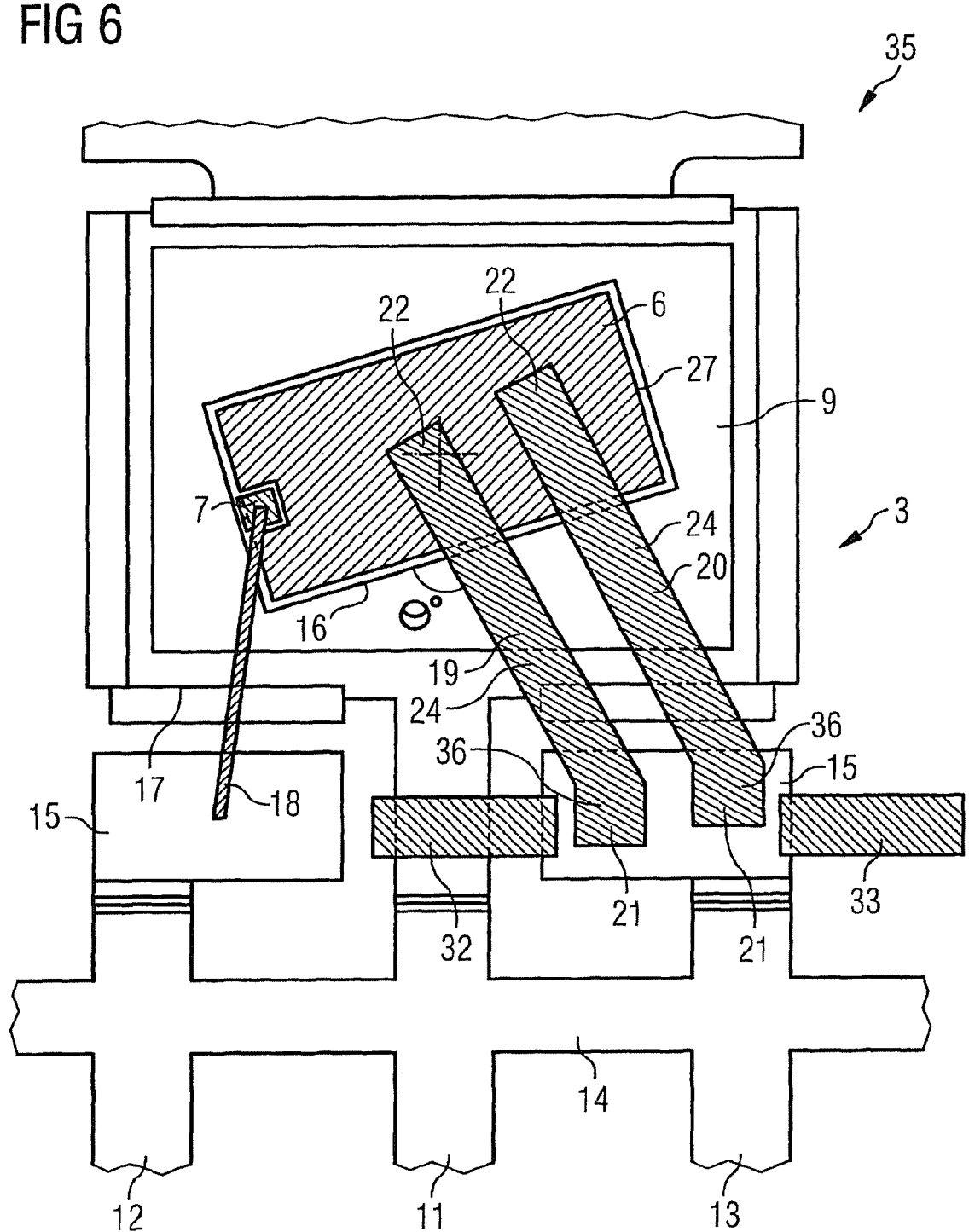
FIG. 6 illustrates the assembly a semiconductor component according to a fourth embodiment of the invention.

FIG. 6 illustrates a semiconductor component 35 assembled using a method according to the invention.

Similarly to the embodiments illustrated in FIGS. 3, 4 and 5, the semiconductor component 35 includes a MOSFET device 27 and a lead frame 3 including a die pad 9 and three leads 10. The MOSFET device 27 is orientated on the die pad 9 so that the long side 16 of the MOSFET device 27 lies at an angle of approximately 20° to the long side 17 of the die pad 9. The inner contact areas 15 have an area B and dimensions essentially the same as the embodiments of FIGS. 3, 4 and 5.

The embodiment of FIG. 6 differs from the embodiments of FIGS. 3 and 5 in that the source electrode 6 is electrically connected to the inner contact area 15 of the source lead 13 by two bond wires 19, 20 which include a kink or bend 36. The first end 21 of each of the source bond wires 19, is positioned so as to be approximately perpendicular to the long side of the inner contact area 15 and approximately parallel to the drain lead 11. The second end 22 of each of the source wires 19,20 is positioned on the source contact 6 of the semiconductor device 27 so as to form an angle of approximately 85° with the long side 16 of the MOSFET device 27. Therefore, the central portion 24 of each of the bond wires 19, 20 lies at an angle of approximately 160° to the direction of the first end 21 of the bond wires 19, 20 which is attached to the inner contact area 15 of the source lead 13.

As can be seen in FIG. 6, this arrangement allows the interfacial bonding area 20 between the two source wires 19, 20 and inner contact area 15 to have an approximately square or rectangular form. This enables bond wires with a larger diameter to be accommodated on an inner contact area with the same lateral dimensions as in the embodiments illustrated in FIGS. 1, 2 and 4. In this embodiment, the bond wires 19, 20 have a diameter of 500 µm.

Furthermore, the interfacial bonding areas 20 can be positioned towards the lateral centre of the inner contact area 15.

This has the advantage, that regions of the inner contact area 15 towards the two short sides remains unoccupied by the bond wires 19, 20. This enables the wire bond clampers 32 and 33 to be positioned so as to clamp the outer regions of the two short sides of the inner contact area 15. This arrangement provides a more stable clamping of the inner contact area as the inner contact area is directly clamped by the two bond wire clamps 32, 33.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for producing a semiconductor component, comprising:
    defining a package layout, the package layout including:
        a die pad having an edge defining a first line and having lateral dimensions;
        a plurality of leads disposed on one side of the die pad, each lead having an inner portion and an outer portion, wherein at least one drain lead extends from the die pad in a direction defining a second line and the inner portion of each of the remaining leads comprises an inner contact area which is spaced at a distance from the die pad, each lead extending in a direction parallel to the second line, the inner contact area having maximum allowable dimensions;
        a semiconductor device having lateral dimensions which are equal to or less than the lateral dimensions of the die pad; and
        a plurality of electrically conductive connecting members,
    defining an area of the inner contact area;
    defining an area of the electrically conductive connecting members;
    orientating a first end of the electrically conductive connecting members with respect to the second line to maximize an interfacial bonding area between the electrically conductive connecting members and a surface of the inner contact area;
    orientating a second end of the electrically conductive connecting members with respect to the first line to maximize an interfacial bonding area between the electrically conductive connecting members and an upper surface of the semiconductor device;
    orientating the semiconductor device with respect to the first line so that the central portions of the electrically conductive connecting members have an orientation with respect to an edge of the semiconductor device which is as close to 90° as possible and so that the semiconductor device remains within the area of the die pad;
    determining an unoccupied area of the inner contact area;
    if the unoccupied area is less than a first predetermined value, then changing the area of the inner contact area and/or the cross-sectional area of the electrically conductive connecting members to increase the unoccupied area;
    if the unoccupied area is equal to or greater than the first predetermined value and if the unoccupied area is larger than a second predetermined value, then increasing the cross-sectional area of the electrically conductive connecting members; and
    if the unoccupied area is equal to or greater than the first predetermined value and if the unoccupied area is not larger than the second predetermined value, then outputting determined values of the area of the inner contact area and the cross sectional area of the electrically conductive conducting members.

2. The method of claim 1, wherein the first predetermined value is an area required by bonding tool clamps.

3. The method of claim 2, wherein the first predetermined value is the area required by the bonding tool clamps in a single pass bonding process.

4. The method of claim 2, wherein the first predetermined value is the area required by the bonding tool clamps in a two pass bonding process.

5. The method of claim 2, further comprising:
    defining an area required by the bonding tool clamp within the area of the inner contact area;
    defining a lateral position of the bonding tool clamp within the area of the inner contact area;
    determining a lateral position of the unoccupied area of the inner contact area;
    comparing the lateral position of the unoccupied area with the defined lateral position of the bonding tool clamp and the defined area required by the bonding tool clamp;
    if the defined lateral position of the bonding tool clamp and the defined area required by the bonding tool clamp lies outside the lateral position of the unoccupied area, then changing the area of the inner contact area and/or the cross-sectional area of the electrically conductive connecting members;
    if the defined lateral position of the bonding tool clamp and the defined area required by the bonding tool clamp lies within the lateral position of the unoccupied area, and if the unoccupied area is larger than the second predetermined value, then increasing the cross-sectional area of the electrically conductive connecting members; and
    if the defined lateral position of the bonding tool clamp and the defined area required by the bonding tool clamp lies within the lateral position of the unoccupied area, and if the unoccupied area is not larger than the second predetermined value, then outputting determined values of the area of the inner contact area and the cross sectional area of the electrically conductive conducting members.

6. The method of claim 1, wherein the second predetermined value is a non-optimum interfacial area.

7. The method of claim 1, further comprising repeating the method until the unoccupied area is equal to or greater than the first predetermined value and the unoccupied area is not larger than the second predetermined value.

8. The method of claim 1, wherein the cross-sectional area of the electrically conductive connecting members is selected from a plurality of pre-defined values.

9. The method of claim 1, wherein the electrically conductive connecting members are bond wires with an essentially circular cross-section.

10. The method of claim 1, wherein the electrically conductive connecting members are foils with an essentially rectangular cross-section.

11. The method of claim 1, wherein the first end of the electrically conductive connecting members is orientated approximately parallel to the second line.

12. The method of claim 1, wherein the second end of the electrically conductive connecting members is orientated approximately perpendicular to the first line.

13. A semiconductor component having a TO252 package outline, comprising:
   a die pad having an edge defining a first line and having a lateral dimension;
   a plurality of leads disposed on one side of the die pad, each lead having an inner portion and an outer portion, wherein at least one drain lead extends from the die pad in a direction defining a second line and the inner portion of each of the remaining leads comprises an inner contact area which is spaced at a distance from the die pad, each lead extending in a direction parallel to the second line;
   a semiconductor device having lateral dimensions which are equal to or less than the lateral dimensions of the die pad, the semiconductor device having a plurality of contacts, wherein the semiconductor device is orientated with respect to the first line by an angle θ, where 0°<θ<90°; and
   a plurality of bond wires with a diameter of greater than approximately 350 μm connecting the contacts of the semiconductor device to the leads.

14. The semiconductor component of claim 13, wherein the bond wires have a diameter of approximately 500 μm.

15. The semiconductor component of claim 13, wherein the semiconductor device is orientated with respect to the first line so that a central portion of the bond wires has an orientation with respect to an edge of the semiconductor device which is as close to 90° as possible and so that the semiconductor device remains within the area of the die pad.

16. The semiconductor component of claim 13, wherein the semiconductor device is a high power semiconductor device.

17. The semiconductor component of claim 13, comprising wherein the semiconductor device is a MOSFET, a IGBT, a BJT or a diode.

* * * * *